(12) United States Patent
Watanabe

(10) Patent No.: US 8,008,203 B2
(45) Date of Patent: Aug. 30, 2011

(54) SUBSTRATE, METHOD OF POLISHING THE SAME, AND POLISHING APPARATUS

(75) Inventor: Junji Watanabe, Kumamoto (JP)

(73) Assignee: National Universtiy Corporation Kumamoto University, Kumamoto (JP)

( * ) Notice: Subject to any disclaimer, the term of this patent is extended or adjusted under 35 U.S.C. 154(b) by 786 days.

(21) Appl. No.: 11/988,213

(22) PCT Filed: Jul. 7, 2006

(86) PCT No.: PCT/JP2006/313601
§ 371 (c)(1),
(2), (4) Date: May 5, 2008

(87) PCT Pub. No.: WO2007/007683
PCT Pub. Date: Jan. 18, 2007

(65) Prior Publication Data
US 2009/0050897 A1    Feb. 26, 2009

(30) Foreign Application Priority Data
Jul. 7, 2005    (JP) .................................. 2005-198640

(51) Int. Cl.
*H01L 21/302* (2006.01)
(52) U.S. Cl. .................................... 438/693; 156/345.12
(58) Field of Classification Search .................. None
See application file for complete search history.

(56) References Cited

U.S. PATENT DOCUMENTS

| | | | | |
|---|---|---|---|---|
| 5,154,023 A | * | 10/1992 | Sioshansi | 451/41 |
| 6,458,704 B2 | * | 10/2002 | Carlson | 438/692 |
| 7,071,108 B2 | * | 7/2006 | Matsui et al. | 438/692 |
| 2003/0062335 A1 | * | 4/2003 | Brewer | 216/38 |
| 2004/0072505 A1 | * | 4/2004 | Matsui et al. | 451/41 |

FOREIGN PATENT DOCUMENTS

| | | | |
|---|---|---|---|
| JP | A-02-199832 | | 8/1990 |
| JP | A-08-139140 | | 5/1996 |
| JP | A-2003-238941 | | 8/2003 |
| JP | A-2004-055615 | | 2/2004 |
| JP | 2004345003 A | * | 12/2004 |
| JP | A-2004-345003 | | 12/2004 |

OTHER PUBLICATIONS

Takenouchi et al, JPO Machine Translation of JP-2004-345003 A.*

* cited by examiner

*Primary Examiner* — Binh X Tran
*Assistant Examiner* — David Cathey, Jr.
(74) *Attorney, Agent, or Firm* — Oliff & Berridge, PLC

(57) ABSTRACT

A polishing method and a polishing apparatus capable of polishing a surface of a substrate made of SiC or diamond extremely smoothly and efficiently without causing subsurface damage are provided. A polishing platen 1 can rotate around a rotating shaft 4, and is made of quartz having high transparency to ultraviolet radiation. A large number of grooves 11 are arranged on a front surface of the polishing platen 1 in a lattice form, and each of the grooves 11 is filled with solid photocatalytic particles 20 ($CeO_2$). The polishing platen 1 is relatively rubbed against a to-be-polished surface 30A of a substrate 30 made of silicon carbide (SiC) or diamond (C) while pressing the polishing platen 1 to the to-be-polished surface 30A of the substrate 30 with a very high pressure, thereby the to-be-polished surface 30A is oxidized by the solid photocatalytic particles 20 to perform chemical polishing. The oxidation of the to-be-polished surface 30A is promoted by applying ultraviolet radiation from an ultraviolet source lamp 2, and polishing is promoted by heating by an infrared source lamp 3.

6 Claims, 3 Drawing Sheets

SUBSTRATE, METHOD OF POLISHING THE SAME, AND POLISHING APPARATUS

TECHNICAL FIELD

The present invention relates to a polishing method for polishing a surface of a substrate made of, for example, silicon carbide (SiC) or diamond (C), a substrate obtained by the method, and a polishing apparatus.

BACKGROUND ART

A SiC single crystal has a high hardness, high heat resistance and high corrosion resistance, and is an extremely chemically stable compound. Moreover, SiC which is a compound semiconductor having a covalent bond has superior properties such as a twice or more larger band gap, an approximately ten times higher dielectric breakdown field strength, an approximately twice higher electron saturation velocity and an approximately three times or more higher thermal conductivity, compared to silicon (Si), so SiC has drawn attention as an effective material for a high-temperature/high-speed/high-current device or a blue light-emitting device (refer to Patent Literature 1).

[Patent Literature 1] Japanese Unexamined Patent Application Publication No. H08-139140

Moreover, a diamond single crystal has the highest mechanical strength, and is chemically and thermally stable, so in recent years, the diamond single crystal has drawn attention as a material specifically suitable for a wide band gap semiconductor substrate.

DISCLOSURE OF THE INVENTION

When SiC or diamond with the many advantages described above is used for a substrate, it is necessary to make its surface extremely smooth. However, a technique of efficiently polishing a substrate made of SiC or diamond with ultra-precision without causing subsurface damage on a to-be-polished surface has not yet been proposed substantially.

In view of the foregoing, there is an object of the invention to provide a polishing method capable of polishing a surface of a substrate made of silicon carbide (SiC), diamond or the like extremely smoothly and efficiently without causing subsurface damage, and a substrate obtained by the method, and a polishing apparatus.

In a polishing method according to the invention, while bringing a to-be-polished surface of a substrate into contact with a polishing platen with a high pressure, and applying ultraviolet radiation from a back surface of the polishing platen to the to-be-polished surface of the substrate, the substrate is polished by relatively rubbing the substrate against the polishing platen, and in particular, in the case where an object to be polished is a substrate made of silicon carbide (SiC) or diamond (C), the polishing method is effective. In the description, "a high pressure" means a pressure of 0.1 MPa or over, and preferably a pressure ranging from 0.1 MPa to 100 MPa.

In other words, in the polishing method according to the invention, for example, the polishing platen is relatively rubbed against a surface of a diamond substrate while pressing the polishing platen to the surface of the diamond substrate with a high pressure, and ultraviolet radiation is applied from the back surface of the polishing platen to the surface of the substrate, thereby the surface of the substrate is strongly oxidized to perform chemical polishing with ultra-precision. In the description, "a substrate" is not limited to a plate-shaped substrate in a general sense, and the thickness and the shape of the substrate is freely selected.

In the polishing method according to the invention, infrared radiation is preferably applied to at least one of the to-be-polished surface of the substrate and the polishing platen to heat it, thereby the polishing efficiency of the above-described substrate is improved.

Moreover, solid photocatalytic particles such as titanium oxide are preferably arranged on a front surface of the polishing platen, thereby the polishing efficiency is improved.

A substrate according to the invention is made of silicon carbide (SiC), diamond (C), gallium arsenide (GaAs) or gallium nitride (GaN), and has a surface polished by the above-described method.

A polishing apparatus according to the invention includes: a polishing platen having a groove or a hole on its front surface, the groove or the hole being filled with solid photocatalytic particles; a substrate holder holding the substrate; a ultraviolet source lamp applying ultraviolet radiation to the solid photocatalytic particles in the polishing platen; and a driving means for pressing a to-be-polished surface of the substrate to the front surface of the polishing platen by the substrate holder with a high pressure, and relatively rubbing the substrate against the solid photocatalytic particles.

In the polishing apparatus, for example, a to-be-polished surface of a diamond substrate is brought into contact with the solid photocatalytic particles held on the polishing platen side, and is relatively rubbed, and ultraviolet radiation is applied to the solid photocatalytic particles, thereby the surface of the substrate is oxidized, and chemical polishing is substantially performed.

In the polishing apparatus, for example, when the to-be-polished surface of the substrate or the polishing platen is heated by a heating means including an infrared source lamp, a polishing function is further promoted.

More specifically, the solid photocatalytic particles include at least one kind selected from the group consisting of cerium oxide ($CeO_2$), titanium dioxide ($TiO_2$), chromium oxide ($Cr_2O_3$), zinc oxide (ZnO), tungsten oxide ($WO_3$) and iron oxide ($F_2O_3$), and may be made of a mixture of at least one kind selected from them, and zirconium oxide ($ZrO_2$), alumina ($Al_2O_3$) or the like.

In the polishing method or the polishing apparatus according to the invention, the surface of the substrate made of SiC or diamond can be polished extremely smoothly and efficiently without causing subsurface damage or the like.

BEST MODE FOR CARRYING OUT THE INVENTION

Preferred embodiment will be described in detail below referring to the accompanying drawings.

First Embodiment

Figure 1:
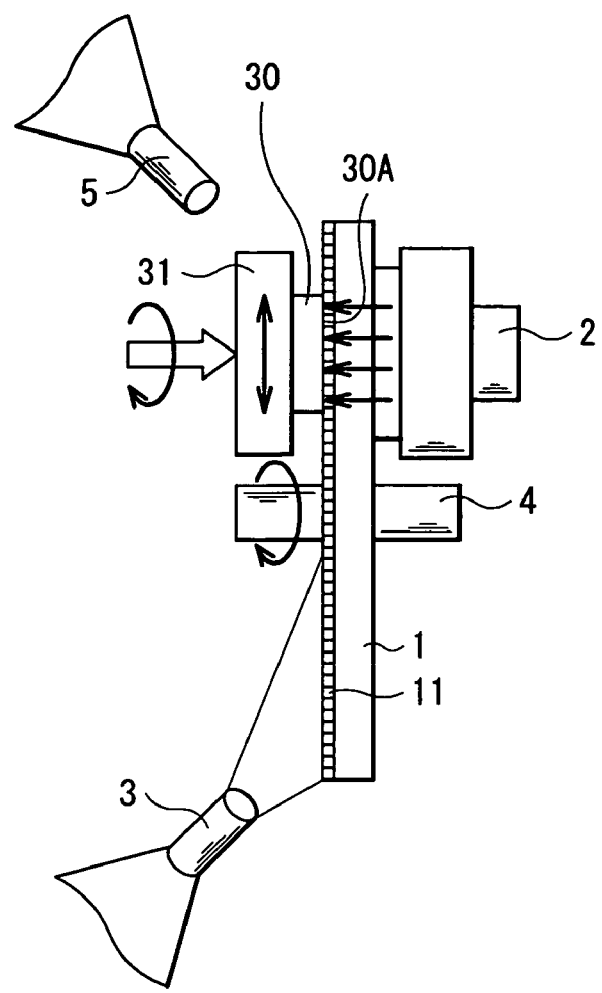
FIG. 1 is a side view showing the configuration of a main part of a polishing apparatus according to a first embodiment of the invention.

FIG. 1 shows the configuration of a polishing apparatus according to a first embodiment of the invention. The polishing apparatus includes a polishing platen 1, an ultraviolet source lamp 2 and an infrared source lamp 3, and polishes a substrate 30 made of, for example, silicon carbide (SiC) or diamond as an object to be polished.

The polishing platen 1 is made of a material having transparency to ultraviolet radiation, for example, quartz, and has a substantially circular disk shape, and a rotating shaft 4 is arranged at the center of the polishing platen 1. The polishing platen 1 rotates (or rotationally moves from side to side) by a rotation torque applied from an external rotating power source (not shown) to the rotating shaft 4.

A large number of lattice-shaped grooves 11 are arranged on a front surface of the polishing platen 1, and the grooves 11 are filled with solid photocatalytic particles 20. Examples of the solid photocatalytic particles 20 include cerium oxide ($CeO_2$), titanium dioxide ($TiO_2$) and chromium oxide ($Cr_2O_3$) all of which have a photocatalytic function, zinc oxide (ZnO), tungsten oxide ($WO_3$) and iron oxide($F_2O_3$), and one kind or a two or more kinds selected from them are used. Moreover, among them, for example, a mixture formed by adding zirconium oxide ($ZrO_2$), alumina ($Al_2O_3$) or the like to $TiO_2$ may be used. The planar shapes of the grooves 11 may have a lattice pattern shown in FIG. 2 as an example, or may have, for example, a radial pattern. A to-be-polished surface 30A of the substrate 30 mechanically supported by a substrate holder 31 is pressed to the front surface of the polishing platen 1 by a pressure plate (not shown) with a high pressure, more specifically with a pressure of 0.1 MPa or over, preferably a pressure ranging from 0.1 MPa to 100 MPa, and polishing is performed in this state.

Figure 3:
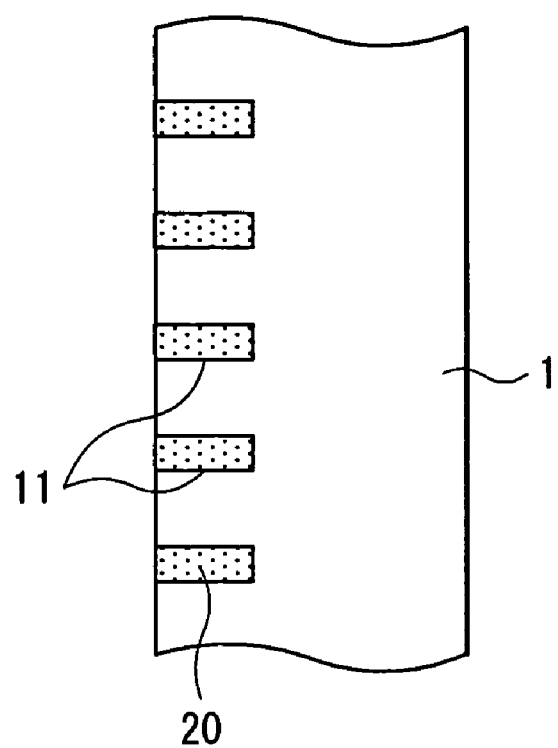
FIG. 3 is an enlarged sectional view showing the polishing platen.

Specifications such as the pitches, depths and widths of the grooves 11 in the polishing platen 1 depend on the size or the like of the substrate 30 made of SiC or diamond to be polished; however, for example, the pitches, widths and depths of the grooves 11 can be set to 1.5 mm, 30 to 50 μm and 0.1 to 0.3 mm, respectively, so that a paste including $TiO_2$ fine particles can be pressed into and filled in the grooves 11 without forming bubbles in the paste, and the paste can be dried and held. FIG. 3 is an enlarged view showing a state in which the grooves 11 are filled with the solid photocatalytic particles 20.

In this case, the solid photocatalytic particles 20 is not limited to be filled in the above-described grooves 11, and a large number of dot-shaped blind holes (not shown) can be spread out on the surface of the polishing platen 1, and the paste-form solid photocatalytic particles 20 can be filled in the blind holes.

The ultraviolet source lamp 2 is arranged on a back surface of the polishing platen 1, and ultraviolet radiation is applied from the back surface of the polishing platen 1 made of quartz to the solid photocatalytic particles 20 in the grooves 11 through the polishing platen 1. As an example, in the case where $TiO_2$ is used as the solid photocatalytic particles 20, the wavelength of ultraviolet radiation is preferably set to, for example, 250 nm so as to promote the oxidation of the to-be-polished surface 30A of the substrate 30. In addition, to excite $TiO_2$ before polishing, the ultraviolet source lamp 5 may be arranged also on the front surface of the polishing platen 1.

The infrared source lamp 3 is arranged on the front surface of the polishing platen 1, and infrared radiation is applied to the front surface of the polishing platen 1 to thermally activate the solid photocatalytic particles 20 on the front surface of the polishing platen 1 or the to-be-polished surface 30A of the substrate 30, thereby to promote the chemical and mechanical polishing efficiency of the to-be-polished surface 30A. Preferably, the heating temperature of the to-be-polished surface 30A is 100° C. to 150° C. in the case of polishing a SiC substrate, and approximately 300° C. to 400° C. in the case of polishing a diamond substrate. By such heating, 3 to 10 times higher polishing efficiency can be achieved, compared to the case where heating is not performed.

As an energy beam for heating, in addition to infrared radiation, laser light such as a YAG laser, an electron beam or the like can be used.

Next, the function of the polishing apparatus will be described below.

At first, after the solid photocatalytic particles 20 (for example, $TiO_2$) are filled in the grooves 11 of the polishing platen 1, and ultraviolet radiation is applied to the solid photocatalytic particles 20 from the ultraviolet source lamp 5 to excite $TiO_2$, in a state in which the to-be-polished surface 30A of the substrate 30 made of SiC or diamond is pressed to the front surface of the polishing platen 1 with a predetermined pressure, the polishing paten 1 is rotated or rotationally moved (rotationally moved back and forth). At this time, quartz of the polishing platen 1 is softer than SiC or diamond of the substrate 30, so the front surface of the polishing platen 1 is worn away gradually. However, even if the front surface of the polishing platen 1 is worn away, while wear of the solid photocatalytic particles 20 filled in the grooves 11 advances, the solid photocatalytic particles 20 continue to be supplied to the front surface of the polishing platen 1 from the grooves 11, so while a polishing process continues (in other words, until wear of the polishing platen 1 advances in a thickness direction to eliminate the grooves 11), the solid photocatalytic particles 20 is continuously supplied to the surface of the polishing platen 1.

On the other hand, together with mechanical polishing operation, ultraviolet radiation is applied from the ultraviolet source lamp 2 arranged on the back surface of the polishing platen 1 to the solid photocatalytic particles 20 arranged between the front surface of the polishing platen 1 and the to-be-polished surface 30A of the substrate 30 made of SiC or diamond through the transparent polishing platen 1. An effective optical energy is supplied to the solid photocatalytic particles 20 by the application of ultraviolet radiation so that strong oxidation of the to-be-polished surface is securely performed.

More specifically, by a strong oxidation function of a hydroxyl group radical or an oxygen radial formed by receiving ultraviolet radiation by the solid photocatalytic particles 20, the to-be-polished surface 30A of the substrate 30 made of SiC or diamond is oxidized. Then, an oxidized portion is removed as carbon monoxide or carbon dioxide. Thus, chemical-polishing proceeds.

In this case, the polishing platen 1 is made of quartz, and quartz has high transparency to ultraviolet radiation. Therefore, as the polishing platen 1 is made of quartz in such a manner, ultraviolet radiation from the ultraviolet source lamp 2 arranged on the back surface of the polishing platen 1 can be applied to the solid photocatalytic particles efficiently (with low loss when ultraviolet radiation passes through the polishing platen 1).

Moreover, at the time of polishing, the front surface of the polishing platen 1 or the to-be-polished surface 30A of the substrate 30 is heated by the application of infrared radiation from the infrared source lamp 3, so the polishing efficiency is further improved. Further, the polishing platen 1 is made of quartz which well absorbs infrared radiation, so heating at this time is extremely effectively performed. When the surface roughness of the to-be-polished surface 30A obtained by actually polishing the substrate 30 made of SiC with the solid photocatalytic particles 20 made of high-purity cerium oxide ($CeO_2$) by the polishing apparatus was determined, the to-be-polished surface 30A could be completed as a most smoothest surface with a surface roughness of Ra=0.2 nm, and the to-be-polished surface 30A was satisfactory.

As described above, in the polishing apparatus according to the embodiment, the substrate 30 made of SiC or diamond which is difficult to be polished by a diamond grindstone in a related art can be polished extremely smoothly and extremely efficiently with ultra-precision without causing subsurface damage or the like.

Second Embodiment

Figure 4:
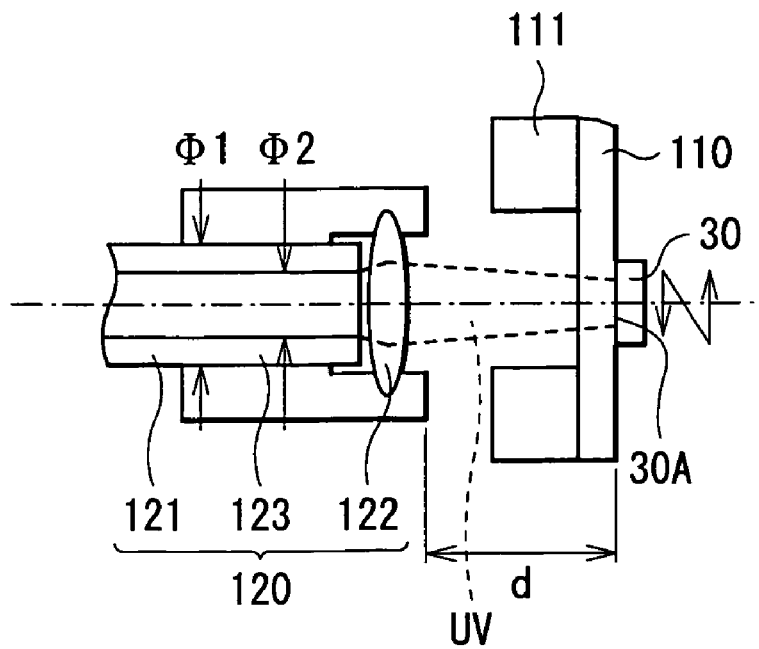
FIG. 4 is a side view showing the configuration of a polishing apparatus according to a second embodiment of the invention.

FIG. 4 shows the configuration of a polishing apparatus according to a second embodiment of the invention. The polishing apparatus includes a polishing platen 110 and an ultraviolet irradiation section 120 applying ultraviolet radiation UW, and polishes the substrate 30 made of, for example, silicon carbide (SiC) or diamond as an object to be polished as in the case of the first embodiment.

The polishing platen 110 is made of a material having high transparency to ultraviolet radiation, for example, quartz, and has a substantially circular disk shape, and the polishing platen 110 is held by a platen holder 111. Moreover, a rotating shaft (not shown) is arranged in the polishing platen 110, and the polishing platen 1 rotates (or rotationally moves from side to side) by a rotation torque applied from an external rotating power source (not shown) to the rotating shaft. The to-be-polished surface 30A of the substrate 30 mechanically supported by a substrate holder (not shown) is pressed to a front surface of the polishing platen 110 by a pressure plate (not shown) with a high pressure, more specifically a pressure of 0.1 MPa or over, preferably a pressure ranging from 0.1 MPa to 100 MPa, and polishing is performed in this state. The diameter of the polishing platen 110 is, for example, 50 mm, and the substrate 130 has, for example, 3 mm □ to 5 mm □.

Figure 2:
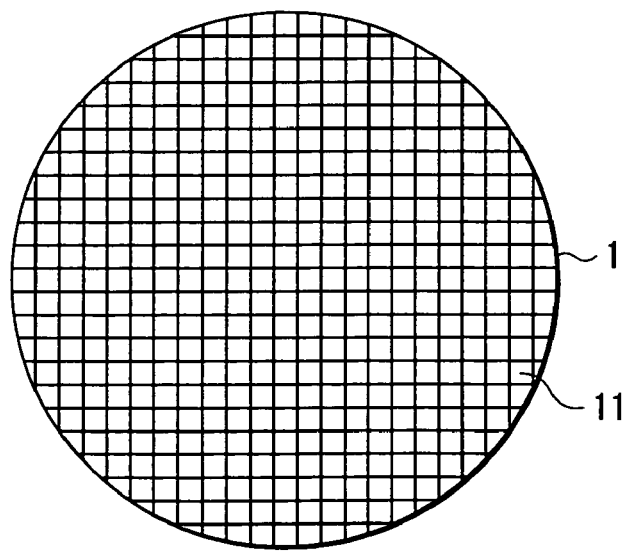
FIG. 2 is an enlarged plan view of a surface of a polishing platen.

As in the case of the polishing platen 1 according to the first embodiment, a large number of lattice-shaped grooves 11 shown in FIGS. 2 and 3 are arranged on the front surface of the polishing platen 110, and the solid photocatalytic particles 20 may be filled in the grooves 11. As the solid photocatalytic particles 20, the same material as that in the first embodiment can be used. The planar shapes, pitches, dimensions and the like of the grooves 11 are the same as those in the first embodiment.

The ultraviolet irradiation section 120 is arranged on a back surface of the polishing platen 110, and applies the ultraviolet radiation TV from the back surface of the polishing platen 110 made of quartz to the to-be-polished surface 30A of the substrate 30 through the polishing platen 110. The ultraviolet radiation UV has a wavelength corresponding to the band gap energy of an object to be processed or less, and, for example, the wavelength of the ultraviolet radiation UV to diamond is preferably 250 nm or less.

The ultraviolet irradiation section 120 includes, for example, a fiber 121 connected to an ultraviolet source (not shown), a condenser lens 122 focusing the ultraviolet radiation UV from the fiber 121 and a lens holder 123 holding the fiber 121 and the condenser lens 122. The fiber 121 has, for example, an outer diameter Φ1 of 8 mm, and an internal diameter Φ2 of 5 mm, and a spot size Φ in diameter by the condenser lens 122 is, for example, approximately 3 mm to 5 mm depending on the dimensions of the substrate 30, and a distance d from the condenser lens 122 to the to-be-polished surface 30A of the substrate 30 is, for example, 10 mm.

In the polishing apparatus, in a state in which the to-be-polished surface 30A of the substrate 30 made of SiC or diamond is pressed to the front surface of the polishing platen 110 with a predetermined pressure, the polishing platen 110 is rotated or rotationally moved (rotationally moved back and forth). At this time, together with mechanical polishing operation, the ultraviolet radiation UV is applied from the back surface of the polishing platen 110 by the ultraviolet irradiation section 120, so the to-be-polished surface 30A of the substrate 30 is oxidized, and chemical polishing proceeds. Therefore, the polishing efficiency is improved.

Thus, in the embodiment, polishing is performed while the ultraviolet radiation UV is applied from the back surface of the polishing platen 110 which is transparent to the ultraviolet radiation UV by the ultraviolet irradiation section 120, so the polishing efficiency can be improved, and the substrate 30 made of SiC or diamond which is difficult to be polished by a diamond grindstone in a related art can be polished extremely smoothly and extremely efficiently with ultra-precision without causing subsurface damage or the like.

In the above-described embodiment, the same ultraviolet source lamp as the ultraviolet source lamp 5 in the first embodiment may be arranged on the front surface of the polishing platen 110. Moreover, the same infrared source lamp as the infrared source lamp 3 in the first embodiment may be arranged on the front surface of the polishing platen 110, and polishing is performed while infrared radiation is applied to the front surface of the polishing platen 110.

Third Embodiment

Figure 5:
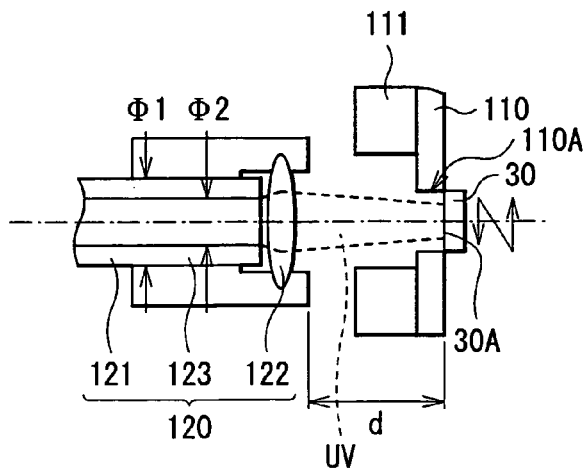
FIG. 5 is a side view showing the configuration of a polishing apparatus according to a third embodiment of the invention.

FIG. 5 shows the configuration of a polishing apparatus according to a third embodiment of the invention. The polishing apparatus has the same configuration as that of the polishing apparatus according to the second embodiment, except that the polishing platen 110 is made of a material opaque to the ultraviolet radiation UV. Therefore, descriptions are given with like components denoted by like numerals.

The polishing platen 110 is made of a material opaque to the ultraviolet radiation UW such as a resin, for example, a polyurethane sheet, and has an ultraviolet passing hole 110A penetrating from the front surface to the back surface, and the ultraviolet radiation UV can be applied to the to-be-polished surface 30A of the substrate 30 through the ultraviolet passing hole 110A. The ultraviolet irradiation section 120 has the same configuration as that in the second embodiment.

The polishing apparatus has the same function as that of the second embodiment, and can obtain the same effect as that of the second embodiment. In particular, in the case where an object to be processed is made of a material with a lower hardness than quartz such as GaAS or GaN, and the polishing platen 110 made of a resin such as a polyurethane sheet is used, the polishing apparatus is effective.

Moreover, a specific example of the invention will be described in detail below.

Figure 6:
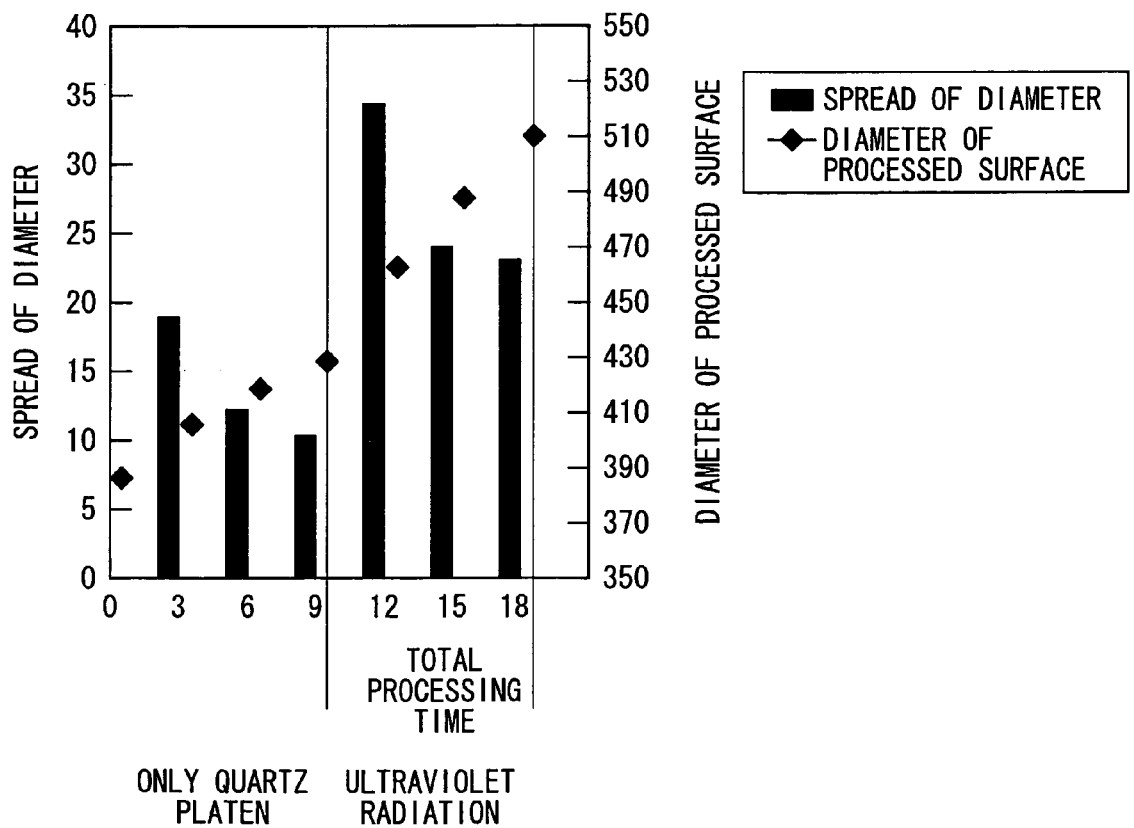
FIG. 6 is a diagram showing results of an example of the invention.

A substrate 130 was polished by a polishing apparatus described in the above-described second embodiment. As the substrate 130, a diamond pin (a single crystal having a (100) plane) was used. When the diameter of the diamond pin before polishing was measured, the diameter was 387.4 μm. For the first 9 hours, polishing was performed only by the polishing platen 110 without the application of the ultraviolet radiation UV. Then, for the next 9 hours, polishing was performed while applying the ultraviolet radiation UV from the back surface of the polishing platen 110. During polishing, the diameter of the diamond pin, the spread thereof and z-axis direction processing efficiency were examined every three hours. To examine the z-axis direction processing efficiency, the angle of inclination was assumed to be 30°. Obtained results are shown in FIG. 6 and Table 1.

TABLE 1

| | BEFORE EXPERIMENT | ONLY QUARTZ PLATEN | | | QUARTZ PLATEN + ULTRAVIOLET RADIATION | | |
|---|---|---|---|---|---|---|---|
| PROCESSING TIME | 0 | 3 | 6 | 9 | 3 | 6 | 9 |
| TOTAL PROCESSING TIME | 0 | 3 | 6 | 9 | 12 | 15 | 18 |
| DIAMETER (μm) | 387.4 | 406.4 | 418.6 | 429.1 | 463.5 | 487.6 | 510.8 |
| SPREAD OF DIAMETER (μm) | | 19 | 12.2 | 10.5 | 34.4 | 24.1 | 23.2 |
| Z-AXIS DIRECTION PROCESSING EFFICIENCY (μm/h) | | 1.83 | 1.15 | 1.01 | 3.31 | 2.32 | 2.23 |

Moreover, when the roughness before processing and the roughness after polishing were examined, the roughness before processing was Ra=5 nm to 8 nm, and the roughness after polishing was Ra=0.2 nm to 0.4 nm.

It was considered that it was impossible to form a diamond (111) plane specifically by mechanical polishing; however, by a polishing method using ultraviolet radiation according to the invention, the roughness was changed from Ra=5 nm to Ra=0.4 nm for 30 minutes.

It was obvious from FIG. 6 and Table 1 that for 9 hours in which polishing was performed while the ultraviolet radiation UV was applied from the back surface of the polishing platen 110, superior results of the spread of the diameter and the z-axis direction processing efficiency were obtained, compared to the first 9 hours in which polishing was performed only by the polishing platen 110. In other words, it was found out that when polishing was performed while the ultraviolet radiation UV was applied from the back surface of the polishing platen 110 to the to-be-polished surface 30A of the substrate 30, the polishing efficiency could be improved.

Although the present invention is described referring to the embodiments and example, the invention is not limited to the above-described embodiments and example, and can be variously modified. For example, in the above-described embodiments and example, an object to be polished is a substrate made of SiC or diamond; however, the invention is not limited to this, and, for example, any other substrate such as a substrate made of gallium arsenide (GaAs), gallium nitride (GaN) or the like may be used.

The invention claimed is:

1. A polishing method, wherein
a polishing platen being made of quartz and having a lattice-shaped groove on its front surface is used, and the groove is filled with solid photocatalytic particles, and while pressing a to-be-polished surface of a substrate made of silicon carbide (SiC) or diamond to the front surface of the polishing platen with a high pressure, applying ultraviolet radiation from a back surface of the polishing platen to the to-be-polished surface of the substrate through the polishing platen, and heating at least one of the front surface of the polishing platen and the to-be-polished surface of the substrate by the application of infrared radiation, the substrate is polished by relatively rubbing the substrate against the polishing platen.

2. The polishing method according to claim 1, wherein
the solid photocatalytic particles include at least one kind selected from the group consisting of cerium oxide ($CeO_2$), titanium dioxide ($TiO_2$), chromium oxide ($Cr_2O_3$), zinc oxide (ZnO), tungsten oxide ($WO_3$) and iron oxide ($Fe_2O_3$).

3. The polishing method according to claim 2, wherein
at least one of zirconium oxide ($ZrO_2$) and alumina ($Al_2O_3$) is added to the solid photocatalytic particles to form a mixture.

4. The polishing method according to claim 1, wherein
a surface of the substrate is oxidized by applying ultraviolet radiation so as to perform chemical polishing.

5. A polishing apparatus for polishing a surface of a substrate made of silicon carbide (SiC), or diamond, the polishing apparatus comprising:
a polishing platen being made of quartz and having a lattice-shaped groove on its front surface, the groove being filled with solid photocatalytic particles;
a substrate holder holding the substrate;
an ultraviolet source lamp being arranged on a back surface of the polishing platen, and applying ultraviolet radiation from the back surface of the polishing platen to the solid photocatalytic particles in the polishing platen through the polishing platen;
a driving means for pressing a to-be-polished surface of the substrate to the front surface of the polishing platen by the substrate holder with a high pressure, and relatively rubbing the substrate against the solid photocatalytic particles; and
a heating means for heating at least one of the to-be-polished surface of the substrate and the front surface of the polishing platen by the application of infrared radiation.

6. The polishing apparatus according to claim 5, wherein
the solid photocatalytic particles include at least one kind selected from the group consisting of cerium oxide ($CeO_2$), titanium dioxide ($TiO_2$), chromium oxide ($Cr_2O_3$), zinc oxide (ZnO), tungsten oxide ($WO_3$) and iron oxide ($Fe_2O_3$).

* * * * *